United States Patent [19]

Guild

[11] Patent Number: 4,464,461
[45] Date of Patent: Aug. 7, 1984

[54] DEVELOPMENT OF LIGHT-SENSITIVE QUINONE DIAZIDE COMPOSITIONS

[75] Inventor: John R. Guild, Rochester, N.Y.

[73] Assignee: Eastman Kodak Company, Rochester, N.Y.

[21] Appl. No.: 516,227

[22] Filed: Jul. 22, 1983

[51] Int. Cl.³ ............................................... G03C 5/34
[52] U.S. Cl. .................................... 430/326; 430/331
[58] Field of Search ................ 430/331, 326; 252/547

[56] References Cited

U.S. PATENT DOCUMENTS 4,141,733  2/1979  Guild ................................... 430/326
4,294,911 10/1981  Guild ................................... 430/326

Primary Examiner—Won H. Louie, Jr.
Attorney, Agent, or Firm—Alfred P. Lorenzo

[57] ABSTRACT

Light-sensitive compositions containing a quinone diazide which are useful in positive-working photoresists and positive-working lithographic printing plates are developed with a developing composition comprising a quaternary alkanol ammonium hydroxide developing agent and a stabilizing concentration of a semicarbazide.

30 Claims, No Drawings

DEVELOPMENT OF LIGHT-SENSITIVE QUINONE DIAZIDE COMPOSITIONS

BACKGROUND OF THE INVENTION

1. Field of the Invention

This invention relates in general to the use of light-sensitive polymeric compositions in the graphic arts to produce photomechanical images and in particular to improvements in the image-forming development of positive-working photoresist films and positive-working lithographic printing plates containing light-sensitive quinone diazides. More specifically, this invention relates to the use of certain developing compositions which provide improved results in the development of the aforesaid photoresist films and printing plates.

2. Description of the Prior Art

An important class of light-sensitive materials that is widely utilized in the graphic arts in the formation of photomechanical images is the class of quinone diazides. These materials enjoy extensive use in such important applications as positive-working photoresist films and positive-working lithographic printing plates. Exposure of the composition to actinic radiation results in a solubility differential between the exposed and unexposed areas such that treatment with an appropriate developer results in removal of the radiation struck areas and retention of the desired image areas on the support. It is believed that such exposure decomposes the diazo structure in the radiation struck areas to form the free carboxylic acid group, thereby rendering the exposed areas soluble in alkaline developer solutions. The developer solutions which are employed for this purpose can be aqueous solutions or organic solutions. Typical examples of alkaline developer solutions utilized heretofore in development of quinone diazide compositions include solutions of sodium hydroxide, ammonium hydroxide, potassium hydroxide, sodium carbonate, sodium silicate or sodium phosphate. Developers containing lower alcohols, ketones, or amines such as the alkyl amines, cycloalkyl amines and alkanolamines, are also well known.

It is known to use quaternary ammonium hydroxide developing agents in developer compositions that are employed in developing light-sensitive quinone diazide compositions. Thus, for example, the use of tetraalkylammonium hydroxides, such as tetramethylammonium hydroxide or tetraethylammonium hydroxide, as developing agents is described in Japanese Patent Publication No. 56226/1976 published May 17, 1976. Use of tetramethylammonium hydroxide as a developing agent is also described in British Pat. No. 1,367,830. Especially useful quaternary ammonium hydroxide developing agents are the quaternary alkanol ammonium hydroxides such as, for example, the methyltriethanolammonium hydroxide of U.S. Pat. No. 4,141,733. As described in this patent, this developing agent is particularly advantageous for use in forming a metal-ion-free developer composition that is especially adapted for forming fine image detail in the utilization of photoresists in the manufacture of integrated circuit devices. Developer compositions containing methyltriethanolammonium hydroxide provide many highly advantageous characteristics such as extended development latitude, increased exposure latitude, improved resist contrast, improved prebake latitude, a low depletion rate and minimal loss of image layer thickness.

While developer compositions containing a quaternary alkanol ammonium hydroxide developing agent are excellent developers for resists of the quinone diazide type, they suffer from a serious problem in that gradual decomposition of the quaternary alkanol ammonium hydroxide compound, with consequent darkening of the composition and changes in its performance as a developer, tends to take place. A solution to this problem is provided in U.S. Pat. No. 4,294,911. The solution is the incorporation in the developing composition of a stabilizing concentration of a sulfite, for example, ammonium sulfite. Sulfites function very effectively as stabilizing agents, that is, as agents which serve to prevent or retard darkening of the composition and changes in its performance as a developer for quinone diazide compositions. As explained in U.S. Pat. No. 4,294,911, it is believed that quaternary alkanol ammonium hydroxide developing agents can decompose to form aldehydes and that the aldehydes can polymerize to form polyaldehydes, which are highly colored materials that result in a gradual darkening of the composition. Depending on the particular conditions involved, the polyaldehydes can be dimers, trimers, oligomers or low molecular weight polymers. Sulfites are believed to form adducts with the aldehydes and thereby prevent the formation of the polyaldehydes.

While the use of sulfites as stabilizing agents represents an important advance in the art, it is subject to a serious disadvantage which has hindered the commercial utilization of developing compositions containing quaternary alkanol ammonium hydroxide developing agents. Such developing compositions are typically prepared, shipped and stored as concentrates and are diluted by the user to the proper concentration. In the preparation and use of such concentrates, it is essential to be able to accurately determine the total solution alkalinity (such term being used herein to refer to alkalinity contributed by the quaternary alkanol ammonium hydroxide as well as by any other basic ingredients in the solution) so as to be able to accurately establish the degree of dilution necessary to provide a working strength developing solution of a particular pH. The activity of these developing solutions is, in part, dependent on pH and the optimum pH in a given situation will depend on various factors, such as the particular ingredients in the light-sensitive composition, the particular ingredients in the developing composition, the type of equipment utilized in exposing the light-sensitive composition, the development temperature, and so forth. Thus, there is a critical need for a simple and effective method of accurately determining the total solution alkalinity of the concentrate. A particularly convenient way of doing this is by titration with an acid, for example, hydrochloric acid. However, it has been found that if a sulfite is used as a stabilizing agent, it interferes with the titration and renders it impossible to accurately determine the total solution alkalinity by a titration process. The exact mechanism whereby such interference occurs is not known, but it has been found through repeated experimentation that significantly different results are obtained when titrating otherwise identical developing compositions depending on whether or not a sulfite is present in the composition. Thus, the use of a sulfite as a stabilizing agent leads to false readings for total solution alkalinity.

It is toward the objectives of providing a developer composition that is stable, so that its performance does not change significantly with the passage of time, i.e., a developer composition that has a relatively long "shelf-life," and of providing a developer composition whose total solution alkalinity can be accurately determined by titration, that the present invention is directed.

SUMMARY OF THE INVENTION

It has now been discovered that incorporation of a semicarbazide in a developer composition containing a quaternary alkanol ammonium hydroxide developing agent will function to stabilize the composition. Specifically, it has been found that the adverse effects resulting from the decomposition of quaternary alkanol ammonium hydroxide developing agents in developer compositions can be prevented, or at least substantially reduced, by incorporating in the composition a stabilizing concentration of a semicarbazide. Thus, the developer compositions of this invention, containing a quaternary alkanol ammonium hydroxide developing agent and a stabilizing concentration of a semicarbazide, have excellent shelf-life characteristics, so that they can be stored for extended periods of time without undergoing substantial changes in their performance as developers. It has also been discovered that when a semicarbazide is used as a stabilizing agent in the aforesaid developer compositions, it will not interfere with the determination of total solution alkalinity by titration.

The developer compositions of this invention can contain any quaternary alkanol ammonium hydroxide developing agent. In a preferred embodiment of the invention, they are metal-ion-free developer compositions. In a particularly preferred embodiment, they are compositions in which the developing agent is methyltriethanolammonium hydroxide.

DESCRIPTION OF THE PREFERRED EMBODIMENTS

Light-sensitive quinone diazides are well known materials which have been extensively described in the patent literature, for example, in U.S. Pat. Nos. 2,754,209, 3,046,110, 3,046,112, 3,046,113, 3,046,116, 3,046,118, 3,046,119, 3,046,120, 3,647,443, and 3,759,711. The monomeric quinone diazide can be incorporated in an alkali-soluble resinous binder or reacted with an alkali-soluble resinous material so that it can be used satisfactorily as a resist material or can withstand the wear on printing plates.

The compositions and elements utilized in the practice of this invention preferably comprise a light-sensitive polymeric compound formed from the condensation reaction of a quinone diazide with a phenol-formaldehyde resin. Advantageously, the quinone diazide which is utilized has a linkage independently selected from the group consisting of

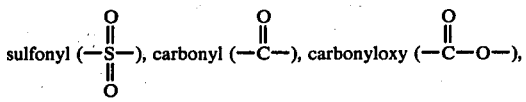

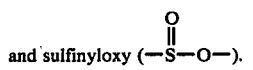

Most preferred is 1,2-naphthoquinone-2-diazide-5-sulfonyl chloride, having the formula

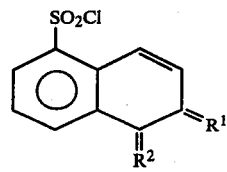

wherein $R^1$ and $R^2$ are interchangeably $N_2$ or O, and $R^1$ and $R^2$ are not the same.

Other quinone diazides useful in the practice of this invention are the acid esters and acid halides of: o-benzoquinone diazide, 1,2-naphthoquinone-1-diazide, 7-methoxy-1,2-naphthoquinone-2-diazide, 6-chloro-1,2-naphthoquinone-2-diazide, 7-chloro-1,2-naphthoquinone-2-diazide, 6-nitro-1,2-naphthoquinone-2-diazide, 5-(carboxymethyl)-1,2-naphthoquinone-1-diazide, 3,3',4,4'-diphenyl bis-quinone-4,4'-diazide, 2,3-phenanthrenequinone-2-diazide, 9,10-phenanthrenequinone-10-diazide, 3,4-chrysenequinone-3-diazide, and the like, including quinone diazides substituted with such groups as alkyl generally having one to eight carbon atoms, e.g., methyl, ethyl, propyl, butyl, amyl, hexyl, heptyl, octyl, etc; alkoxy generally having 1 to 8 carbon atoms, e.g., methoxy, ethoxy, propoxy, butoxy, amyloxy, hexyloxy, heptyloxy, octyloxy, etc; and like substituents which do not interfere with the photosensitive properties of the quinone diazide.

The phenol-formaldehyde resins used in the practice of this invention, such as novolac or resole resins, are described in Chapter XV of "Synthetic Resins in Coatings," H. P. Preuss, Noyes Development Corporation (1965), Pearl River, N.Y.

The novolac resins are prepared by the condensation of phenols and aldehydes under acidic conditions whereas the resole resins are prepared under basic conditions. Less than 6 moles of formaldehyde are used per 7 moles of phenol to provide products which are permanently fusible and soluble. In a typical synthesis, novolacs are prepared by heating 1 mole of phenol with 0.5 mole of formaldehyde under acidic conditions. The temperatures at which the reaction is conducted are generally from about 25° to about 175° C.

These resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxy-phenol, chlorophenol, resorcinol, hydroquinone, naphthol, 2,2-bis(p-hydroxyphenol) propane and the like. Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable phenolic resins are those which are insoluble in water and trichloroethylene but readily soluble in conventional organic solvents such as methyl ethyl ketone, acetone, methanol, ethanol, etc. Phenolic resins having a particularly desirable combination of properties are those which have an average molecular weight in the range between about 350 and 40,000, and preferably in the range between about 350 and 10,000.

Preferred phenolic resins are cresol-formaldehyde and phenol-formaldehyde.

The light-sensitive polymeric compounds which are particularly useful in the present invention are prepared from condensation reactions of a suitable quinone diazide (e.g. one of those listed above) with a suitable phenol-formaldehyde resin. These reactions are usually carried out in an organic medium, such as dioxane, tetrahydrofuran, acetone, etc, where the concentration of the reactive compounds is in the range of 1 to 50 percent of the solution weight; at a temperature in the range of 0° C. to 78° C. and at various pressures, preferably atmospheric pressure. The molar ratio of quinone diazide to phenol-formaldehyde resin is in the range of about 99:1 to about 1:99 and preferably from 1:50 to 1:5. The resulting quinone diazide phenol-formaldehyde polymer can be collected by precipitation of the reaction product into a dilute acid, such as hydrochloric acid and filtering.

The light-sensitive quinone diazide compositions disclosed herein can further comprise a non-light-sensitive film-forming polymer wherein the weight ratio of light-sensitive polymer to non-light sensitive polymer is in the range of about 1:1 to about 99:1. As the amount of quinone diazide used in a photosensitive composition is increased, the described amount of non-light-sensitive polymer increases.

The non-light-sensitive polymers are typically addition homopolymers or interpolymers formed by the addition polymerization of one or more unsaturated compounds containing the unit $>C=C<$ and generally having a molecular weight in the range of about 2000 to about 50,000, although they can have higher or lower molecular weights for particular applications.

Unsaturated compounds which can be homopolymerized or interpolymerized and used as non-light-sensitive polymeric binders include vinyl amines, vinyl imines, substituted and unsubstituted styrenes, acrylates and methacrylates such as alkyl acrylates and alkyl methacrylates, vinyl halides, vinyl esters, vinyl ethers, vinyl ketones, divinyl ethers, acrylonitrile, mixed ester-amides and maleic anhydride, 1,3-butadiene, isoprene, chloroprene, divinylbenzene, acrylic and methacrylic acid derivatives such as nitriles and amides, and others known to those having ordinary skill in the art.

Interpolymers and homopolymers can be prepared by any suitable method including addition polymerization, for example, bulk, solution, bead and emulsion polymerization methods in the presence of a polymerization initiator. For example, polymerization of aminostyrene is conveniently carried out by contacting a mixture of aminostyrene and another polymerizable ethylenically unsaturated compound with from 0.1% to 10%, preferably 0.2 to 2%, of a free-radical-liberating polymerization initiator.

Examples of suitable initiators are peroxy compounds, for example, benzoyl peroxide or di(tertiary amyl) peroxide and azo initiators, for example, 1,1'-azodicyclohexanecarbonitrile or azodiisobutyronitrile. The polymerization can be carried out in the presence or absence of an inert solvent such as a hydrocarbon, for example, benzene, white mineral oil or lubricating oil, acetic acid, dioxane, etc, and preferably in an inert atmosphere, for example, under a blanket of nitrogen. The mixture is maintained at a temperature at which the polymerization initiator generates free radicals rapidly. The exact temperature selected depends on the particular initiator being used. Temperatures ranging from room temperature or lower up to 150° C. or higher are suitable. It is usually desirable to carry the polymerization substantially to completeness so that no unpolymerized monomer remains and the proportions of each component in the final product are essentially those of the original monomer mixture.

Other non-light-sensitive polymers suitable for use in the present invention are film-forming condensation resins, such as phenol-formaldehyde resins and others known to those having ordinary skill in the art.

Photosensitive compositions can be prepared by forming a solution of the light-sensitive polymeric compound alone or mixed with a film forming non-light-sensitive material. These compositions can then be used to form resists or lithographic plates.

The solvents which can be employed as coating solvents in preparing coating compositions with the light-sensitive materials described herein are preferably organic solvents which may be selected from those which are capable of dissolving at least 0.2% by weight of the light-sensitive materials employed but are unreactive toward the light-sensitive materials and which are substantially incapable of attacking the substrates employed. Exemplary solvents include dimethylformamide, cyclohexane, cyclohexanone, acetonitrile, 2-ethoxyethanol, acetone, 4-butyrolactone, ethylene glycol monomethyl ether acetate, 2-methoxyethyl acetate, butyl acetate, and mixtures of these solvents with each other or with one or more of the lower alcohols and ketones.

The concentrations of light-sensitive polymer in the coating solutions are dependent upon the nature of the light-sensitive materials, the supports and the coating method employed. Particularly useful coatings are obtained when the coating solutions contain from about 0.05 to about 25 percent by weight of light-sensitive material.

It will be recognized that additional components can be included in the coating compositions described herein. For example, dyes and/or pigments can be included to obtain colored images; resins, stabilizers and surface active agents can be utilized to improve film formation, coating properties, adhesion of the coatings to the supports employed, mechanical strength, chemical resistance, etc.

Photosensitive elements bearing layers of the polymeric materials disclosed herein can be prepared by coating the photosensitive compositions from solvents onto supports in accordance with usual practices. Suitable support materials include fiber base materials such as paper, polyethylene-coated paper, polypropylene-coated paper, parchment, cloth, etc; sheets and foils of such metals as aluminum, copper, magnesium, zinc, etc; glass and glass coated with such metals as chromium, chromium alloys, steel, silver, gold, platinum, etc; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. For the manufacture of integrated circuit devices, silicon wafers are typically utilized as the support material. The supports, and especially polymeric supports such as poly(ethylene terephthalate), can be subcoated with materials which aid adhesion to the support. A preferred class of subcoatings are polymers, copolymers and terpolymers of vinylidene chloride alone or with acrylic monomers such as acrylonitrile, methyl acrylate, etc, and unsaturated dicarboxylic acids such as itaconic acid, etc. The support can also carry a filter or antihalation layer composed of a dyed polymer layer which absorbs the exposing radiation after it passes through the light-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation. The optimum coating thickness of the light-sensitive layer will depend upon such factors as the use to which the coating will be put, the particular light-sensitive polymer employed, and the nature of other components which may be present in the coating.

The photographic elements employed in the present invention can be imagewise exposed by conventional methods to a source of actinic radiation which is preferably a source which is rich in ultraviolet light. Suitable sources include carbon arc lamps, mercury vapor lamps, fluorescent lamps, tungsten filament lamps, lasers, and the like. The exposed elements can then be developed by flushing, soaking, swabbing, or otherwise treating the light-sensitive layers with the developing composition of this invention. The exposed areas of the coating will be removed by the developing composition while the unexposed areas will be unaffected. The development time can vary widely depending on such factors as the strength of the developing composition and the particular light-sensitive composition utilized, and can range from a few seconds to several minutes, most typically from about 30 seconds to about 120 seconds.

A preferred procedure for forming the element comprises cleaning the surface which is to be etched, applying the photoresist solution by a suitable technique such as spraying, dipping or whirl coating, and then drying the coating. If desired, a prebake of 10 to 30 minutes at 80° C. to 100° C. is given to remove residual solvent and the coating is exposed through a pattern to a light source. The resist coating is then placed in the developing composition to remove the exposed areas. The developing composition can also contain dyes and/or pigments and hardening agents. The developed image is rinsed with distilled water, dried and, optionally, post-baked for 15 to 30 minutes at 80° C. to 150° C. The substrate can then be etched by an appropriate acid etching solution.

As described hereinabove, the developer compositions of this invention comprise a quaternary alkanol ammonium hydroxide developing agent and a stabilizing concentration of a semicarbazide. The semicarbazide functions to stabilize the developer composition, that is, to prevent or retard darkening of the composition and changes in its performance as a developer for quinone diazide compositions. While applicant is not certain of the mechanism whereby semicarbazides serve to stabilize these developing compositions, and does not wish to be bound by any theoretical explanation of the manner in which his invention functions, it is believed that quaternary alkanol ammonium hydroxide developing agents can decompose to form aldehydes and that the aldehydes can polymerize to form polyaldehydes, which are highly colored materials that result in a gradual darkening of the compositions. Depending on the particular conditions involved, the polyaldehydes can be dimers, trimers, oligomers or low molecular weight polymers. Semicarbazides are believed to react with the aldehydes to form semicarbazones and thereby prevent the formation of the polyaldehydes.

By the term "a semicarbazide," as used herein and in the appended claims, is meant semicarbazide; water-soluble acid addition salts of semicarbazide such as the hydrochloride, sulfate, phosphate or nitrate; derivatives of semicarbazide such as 4-methyl-3-semicarbazide, 4-amino-3-semicarbazide (commonly referred to as carbohydrazide), or thiosemicarbazide; and water-soluble acid addition salts of derivatives of semicarbazide.

The semicarbazides which can be employed in accordance with this invention are compounds characterized by the presence of the group

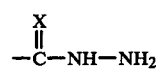

were X is oxygen or sulfur.

Preferred semicarbazides for the purposes of this invention can be represented by the formula:

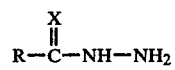

where R is amino, alkylamino of 1 to 6 carbon atoms, dialkylamino of 2 to 12 carbon atoms, phenylamino, diphenylamino, hydrazino, aminocarbonyl or hydrazinocarbonyl and X is oxygen or sulfur.

Illustrative species which are representative semicarbazides of utility for the purposes of this invention include:
semicarbazide
semicarbazide hydrochloride
semicarbazide nitrate
semicarbazide phosphate
semicarbazide sulfate
4-methyl-3-semicarbazide
4-ethyl-3-semicarbazide
4-phenyl-3-semicarbazide
carbohydrazide
oxamic hydrazide
oxalyl dihydrazide
thiosemicarbazide
4-methyl-3-thiosemicarbazide
thiosemicarbazide hydrochloride
and the like.

It is unexpected and surprising that a semicarbazide is an effective stabilizing agent for developing composition containing quaternary alkanol ammonium hydroxides and yet does not interfere wih the determination of total solution alkalinity by titration. The sulfites of U.S. Pat. No. 4,294,911 are also effective stabilizers, but their interference with the determination of total solution alkalinity by titration is a serious problem which significantly detracts from their usefulness. Moreover, it has been found that hydroxylamines, such as hydroxylamine hydrochloride, which react with aldehydes to form oximes, and phenylhydrazines, such as phenylhydrazine hydrochloride, which react with aldehydes to form phenylhydrazones, exhibit stabilizing activity. However, both of these types of compounds, namely hydroxylamines and phenylhydrazines, interfere with the determination of total solution alkalinity by titration. A further advantage of a semicarbazide is its very high degree of stabilizing effectiveness, whereby it can be utilized in the developing composition at a much lower concentration than a sulfite.

Typical quaternary alkanol ammonium hydroxide developing agents which can be used in the developing compositions of this invention are those represented by the general formula:

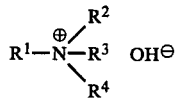

wherein $R^1$ is a hydroxyalkyl radical, preferably containing 2 to 8 carbon atoms, and each of $R^2$, $R^3$ and $R^4$ is independently selected from the group consisting of hydrocarbyl radicals, preferably containing 1 to 10 carbon atoms, and hydroxylalkyl radicals, preferably containing 2 to 8 carbon atoms.

The quaternary alkanol ammonium hydroxide developing agents which are advantageously used in the developing composition of this invention include:

(a) tetraalkanolammonium hydroxides such as tetraethanolammonium hydroxide which has the formula:

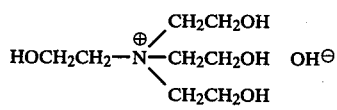

(b) monoalkyltrialkanolammonium hydroxides such as methyltriethanolammonium hydroxide which has the formula:

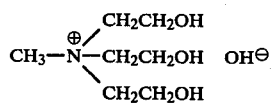

(c) dialkyldialkanolammonium hydroxides such as dimethyldiethanolammonium hydroxide which has the formula:

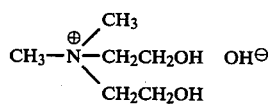

(d) trialkylmonoalkanolammonium hydroxides such as trimethylethanolammonium hydroxide which has the formula:

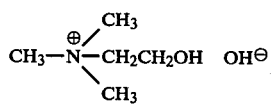

(e) monoalkylmonoaryldialkanolammonium hydroxides such as benzylmethyldiethanolammonium hydroxide which has the formula:

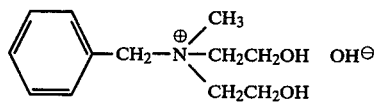

(f) dialkylmonoarylmonoalkanolammonium hydroxides such as benzyldimethylethanolammonium hydroxide which has the formula:

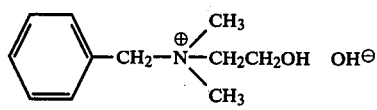

and (g) monoaryltrialkanolammonium hydroxides such as benzyltriethanolammonium hydroxide which has the formula:

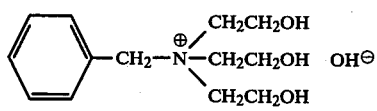

Preferred quaternary alkanol ammonium hydroxide developing agents for the purposes of this invention are compounds of the formula:

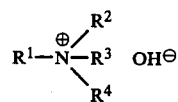

wherein $R^1$ is a hydroxyalkyl radical of 2 to 8 carbon atoms, $R^2$ is a hydrocarbyl radical of 1 to 10 carbon atoms, $R^3$ is a hydroxyalkyl radical of 2 to 8 carbon atoms or a hydrocarbyl radical of 1 to 10 carbon atoms, and $R^4$ is a hydroxyalkyl radical of 2 to 8 carbon atoms or a hydrocarbyl radical of 1 to 10 carbon atoms.

Especially preferred for the purposes of this invention are the quaternary alkanol ammonium hydroxide developing agents of the formula:

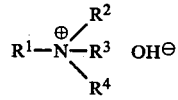

wherein $R^1$ is a hydroxylalkyl radical of 2 to 4 carbon atoms, $R^2$ is an alkyl radical of 1 to 4 carbon atoms, $R^3$ is a hydroxyalkyl radical of 2 to 4 carbon atoms, or an alkyl radical of 1 to 4 carbon atoms, and $R^4$ is a hydroxyalkyl radical of 2 to 4 carbon atoms or an alkyl radical of 1 to 4 carbon atoms.

The developing compositions of this invention include a stabilizing concentration of a semicarbazide. The optimum amount of semicarbazide will depend on several factors, such as the particular developing agent employed, the concentration of the developing agent in the developing composition, the pH of the developing composition, and so forth. Typically, the semicarbazide should be included in the developing composition in an amount of from about 0.005 to about 1 moles per mole of developing agent, more usually in an amount of from about 0.008 to about 0.1 moles per mole, and preferably in an amount of from about 0.01 to about 0.04 moles per mole. In addition to the quaternary alkanol ammonium hydroxide developing agent and the semicarbazide, the developing compositions can also contain optional ingredients which serve to modify their performance, such as surfactants or organic solvents.

In the developing compositions of this invention, the quaternary alkanol ammonium hydroxide compound can be employed in any amount sufficient to act as a developing agent. Preferably, the developing composition employed as a working solution is an aqueous solution containing from about 1 to about 40 percent by weight, and more preferably about 3 to about 25 percent by weight, of the quaternary alkanol ammonium hydroxide. The optimum concentration of quaternary alkanol ammonium hydroxide is dependent upon a number of factors, such as the particular compound utilized, the particular light-sensitive material to which the developing composition is applied, and the desired development time. Typically, the developing compositions are prepared and stored in the form of aqueous concentrates, having a much higher concentration of quaternary alkanol ammonium hydroxide than is desired in the working solution and then are diluted with water prior to use. This is economically advantageous in that it reduces the amount of water which must be shipped and stored. The semicarbazide is incorporated in the aqueous concentrate in a sufficient amount to enable it to be stored for prolonged periods of time, for example, periods of up to a year or more, without significant change in its characteristics.

An important requirement in the commercial utilization of photomechanical imaging processes is the ability to form a fine, highly detailed image pattern. This is particularly critical in the utilization of photoresists in the semiconductor industry, for example, in the manufacture of integrated circuit devices. One of the problems restricting the capability of producing the desired fine image detail is contamination of the surface of the substrate by metal ions, such as sodium or potassium ions, which are present in the developer solution. Contamination with such ions can deteriorate the substrate conductivity and adversely affect important properties of the integrated circuit device such as electrical resistivity. Thus, in a preferred embodiment of the present invention, the developing composition is free, or at least substantially free, of metal ions.

As described in U.S. Pat. No. 4,141,733, methyltriethanolammonium hydroxide is a particularly effective developer within the class of quaternary alkanol ammonium hydroxide developing agents. Accordingly, a particularly preferred embodiment of the present invention is a developing composition comprising methyltriethanolammonium hydroxide and a stabilizing concentration of a semicarbazide.

The invention is further illustrated by the following example of its practice. Semicarbazide hydrochloride

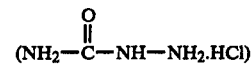

was added in the quantities indicated below to samples of an aqueous concentrate containing 46 percent by weight of methyltriethanolammonium hydroxide. For purposes of comparison, a control sample was also prepared containing 5 percent by weight of ammonium sulfite. The samples, all of which were light-yellow in color, were stored at 72° F. in white polyethylene bottles. After six months of storage, each sample was inspected to determine if the color had changed from the original light-yellow color. After diluting each sample with nine parts of distilled water per part of sample, ultraviolet absorbency measurements were made using the 355 nm line of a Beckman Model 26 Spectrophotometer. The results obtained were as follows:

| Sample No. | Concentration of Semicarbazide Hydrochloride (Weight %) | Moles of Semicarbazide Hydrochloride per Mole of Developing Agent | Original Color | Color After Six Months | Absorbency at 355 nm |
| --- | --- | --- | --- | --- | --- |
| 1 | 0 | 0 | Light Yellow | Dark Brown | 1.105 |
| 2 | 0.025 | 0.0009 | Light Yellow | Dark Brown | 1.050 |
| 3 | 0.063 | 0.0023 | Light Yellow | Dark Brown | 0.831 |
| 4 | 0.125 | 0.0045 | Light Yellow | Dark Brown | 0.382 |
| 5 | 0.25 | 0.009 | Light Yellow | Light Yellow | 0.042 |
| 6 | 0.50 | 0.018 | Light Yellow | Light Yellow | 0.034 |
| 7 | 1.00 | 0.036 | Light Yellow | Light Yellow | 0.025 |
| Control | — | — | Light Yellow | Light Yellow | 0.057 |

As the above results indicate, storage of the concentrate (Sample No. 1) to which no semicarbazide hydrochloride was added resulted in a pronounced color change, in that the concentrate, which was originally light yellow in color, had changed to a dark brown. The results further show that addition of semicarbazide hydrochloride retarded the rate of discoloration and that, when a sufficient amount of semicarbazide hydrochloride was added, no significant color change occurred in a period of storage of six months. The greater effectiveness of semicarbazide hydrochloride in comparison with ammonium sulfite is demonstrated by the control test which indicated that ammonium sulfite at a concentration of 5 weight percent is less effective than semicarbazide hydrochloride at a concentration of 0.25 weight percent (an absorbency value of 0.042 for the semicarbazide hydrochloride at 0.25 weight percent compared to an absorbency value of 0.057 for the ammonium sulfite at 5 weight percent).

The effects of the stabilizing agent on the measurement of total solution alkalinity by titration with hydrochloric acid are shown in the following table. In each case, the stabilizing agent was incorporated, in the amount indicated, in 400 grams of developing solution concentrate consisting of a 46 percent by weight aqueous solution of methyltriethanolammonium hydroxide.

| Test No. | Stabilizing Agent | Amount of Stabilizing Agent (grams) | Alkalinity (milli-equivalents/gram) |
| --- | --- | --- | --- |
| 1 | None | — | 3.194 |
| 2 | Ammonium sulfite | 20 | 2.355 |
| 3 | Semicarbazide hydrochloride | 0.25 | 3.164 |

| Test No. | Stabilizing Agent | Amount of Stabilizing Agent (grams) | Alkalinity (milli-equivalents/gram) |
|---|---|---|---|
| 4 | Semicarbazide hydrochloride | 1.0 | 3.117 |
| 5 | Semicarbazide hydrochloride | 4.0 | 3.069 |

As indicated by the data presented above, the semicarbazide hydrochloride has much less of an effect on the determination of alkalinity than does the ammonium sulfite.

While applicant is not certain of the mechanism whereby his invention functions, he has determined by chemical analysis that during storage of a concentrated aqueous solution of methyltriethanolammonium hydroxide, a gradual degradation occurs resulting in the formation of small amounts of acetaldehyde and triethanolamine. These degradation products are believed to react in some manner under the influence of their highly alkaline environment to produce colored compounds that darken progressively with time. By incorporating a stabilizing concentration of semicarbazide hydrochloride in the concentrated solution of methyltriethanolammonium hydroxide, the rate of discoloration is substantially reduced and the original development latitude is substantially preserved. Moreover, the semicarbazide hydrochloride does not enter into reactions which interfere with titration of the concentrate, nor hinder such titration in any other manner, so that determination of total solution alkalinity by titration can be effectively performed.

The invention has been described in detail with particular reference to preferred embodiments thereof, but it will be understood that variations and modifications can be effected within the spirit and scope of the invention.

I claim:

1. A developing composition for use in developing an imagewise-exposed layer of a light-sensitive quinone diazide composition, said developing composition comprising a quaternary alkanol ammonium hydroxide developing agent and a stabilizing concentration of a semicarbazide.

2. A developing composition as claimed in claim 1 wherein said quaternary alkanol ammonium hydroxide developing agent has the formula:

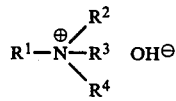

wherein $R^1$ is a hydroxyalkyl radical and each of $R^2$, $R^3$ and $R^4$ is independently selected from the group consisting of hydrocarbyl radicals and hydroxyalkyl radicals.

3. A developing composition as claimed in claim 1 wherein said quaternary alkanol ammonium hydroxide developing agent has the formula:

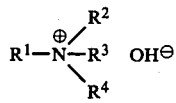

wherein
$R^1$ is a hydroxyalkyl radical of 2 to 8 carbon atoms,
$R^2$ is a hydrocarbyl radical of 1 to 10 carbon atoms,
$R^3$ is a hydroxyalkyl radical of 2 to 8 carbon atoms or a hydrocarbyl radical of 1 to 10 carbon atoms,
and $R^4$ is a hydroxyalkyl radical of 2 to 8 carbon atoms or a hydrocarbyl radical of 1 to 10 carbon atoms.

4. A developing composition as claimed in claim 1 wherein said quaternary alkanol ammonium hydroxide developing agent is selected from the group consisting of:
tetraalkanolammonium hydroxides,
monoalkyltrialkanolammonium hydroxides,
dialkyldialkanolammonium hydroxides,
trialkylmonoalkanolammonium hydroxides,
monoalkylmonoaryldialkanolammonium hydroxides,
dialkylmonoarylmonoalkanolammonium hydroxides,
and monoaryltrialkanolammonium hydroxides.

5. A developing composition for use in developing an image-wise exposed layer of a light-sensitive quinone diazide composition, said developing composition comprising (1) a quaternary alkanol ammonium hydroxide developing agent of the formula:

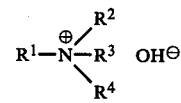

wherein
$R^1$ is a hydroxyalkyl radical of 2 to 4 carbon atoms,
$R^2$ is an alkyl radical of 1 to 4 carbon atoms,
$R^3$ is a hydroxyalkyl radical of 2 to 4 carbon atoms or an alkyl radical of 1 to 4 carbon atoms,
and $R^4$ is a hydroxyalkyl radical of 2 to 4 carbon atoms or an alkyl radical of 1 to 4 carbon atoms,
and (2) a stabilizing concentration of a semicarbazide.

6. A developing composition for use in developing an image-wise exposed layer of a light-sensitive quinone diazide composition, said developing composition being an aqueous composition that is substantially free of metal ions and comprises (1) from about 3 to about 25 percent by weight of a quaternary alkanol ammonium hydroxide developing agent of the formula:

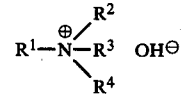

wherein
$R^1$ is a hydroxyalkyl radical of 2 to 4 carbon atoms,
$R^2$ is an alkyl radical of 1 to 4 carbon atoms,
$R^3$ is a hydroxyalkyl radical of 2 to 4 carbon atoms or an alkyl radical of 1 to 4 carbon atoms,
and $R^4$ is a hydroxyalkyl radical of 2 to 4 carbon atoms or an alkyl radical of 1 to 4 carbon atoms,
and (2) from about 0.01 to about 0.04 moles of a semicarbazide per mole of said developing agent.

7. A developing composition as claimed in claim 1 wherein said semicarbazide is selected from the group consisting of (1) compounds of the formula:

where R is amino, alkylamino of 1 to 6 carbon atoms, dialkylamino of 2 to 12 carbon atoms, phenylamino, diphenylamino, hydrazino, aminocarbonyl or hydrazinocarbonyl and X is oxygen or sulfur, and (2) water-soluble acid addition salts thereof.

8. A developing composition as claimed in claim 1 wherein said semicarbazide is semicarbazide hydrochloride.

9. A developing composition for use in developing an imagewise-exposed layer of a light-sensitive quinone diazide composition, said developing composition consisting essentially of an aqueous solution of methyltriethanolammonium hydroxide and semicarbazide hydrochloride.

10. In a process for forming a resist image which comprises developing an imagewise-exposed layer of a light-sensitive quinone diazide composition with an alkaline developing composition, the improvement wherein said alkaline developing composition comprises a quaternary alkanol ammonium hydroxide developing agent and a stabilizing concentration of a semicarbazide.

11. The process as claimed in claim 10 wherein said quaternary alkanol ammonium hydroxide developing agent has the formula:

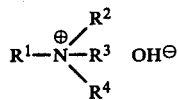

wherein $R^1$ is a hydroxyalkyl radical and each of $R^2$, $R^3$ and $R^4$ is independently selected from the group consisting of hydrocarbyl radicals and hydroxyalkyl radicals.

12. The process as claimed in claim 10 wherein said quaternary alkanol ammonium hydroxide developing agent has the formula:

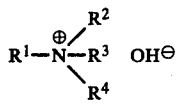

wherein
$R^1$ is a hydroxyalkyl radical of 2 to 8 carbon atoms,
$R^2$ is a hydrocarbyl radical of 1 to 10 carbon atoms,
$R^3$ is a hydroxyalkyl radical of 2 to 8 carbon atoms or a hydrocarbyl radical of 1 to 10 carbon atoms,
and $R^4$ is a hydroxyalkyl radical of 2 to 8 carbon atoms or a hydrocarbyl radical of 1 to 10 carbon atoms.

13. The process as claimed in claim 10 wherein said quaternary alkanol ammonium hydroxide developing agent is selected from the group consisting of
tetraalkanolammonium hydroxides,
monoalkyltrialkanolammonium hydroxides,
dialkyldialkanolammonium hydroxides,
trialkylmonoalkanolammonium hydroxides,
monoalkylmonoaryldialkanolammonium hydroxides,
dialkylmonoarylmonoalkanolammonium hydroxides,
and monoaryltrialkanolammonium hydroxides.

14. The process as claimed in claim 10 wherein said quaternary alkanol ammonium hydroxide developing agent has the formula:

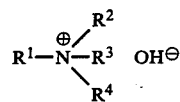

wherein
$R^1$ is a hydroxyalkyl radical of 2 to 4 carbon atoms,
$R^2$ is an alkyl radical of 1 to 4 carbon atoms,
$R^3$ is a hydroxyalkyl radical of 2 to 4 carbon atoms or an alkyl radical of 1 to 4 carbon atoms,
and $R^4$ is a hydroxyalkyl radical of 2 to 4 carbon atoms or an alkyl radical of 1 to 4 carbon atoms.

15. The process as claimed in claim 10 wherein said developing composition is an aqueous composition that is substantially free of metal ions and comprises: (1) from about 3 to about 25 percent by weight of a quaternary alkanol ammonium hydroxide developing agent of the formula:

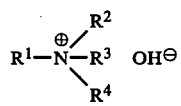

wherein
$R^1$ is a hydroxyalkyl radical of 2 to 4 carbon atoms,
$R^2$ is an alkyl radical of 1 to 4 carbon atoms,
$R^3$ is a hydroxyalkyl radical of 2 to 4 carbon atoms or an alkyl radical of 1 to 4 carbon atoms,
and $R^4$ is a hydroxyalkyl radical of 2 to 4 carbon atoms or an alkyl radical of 1 to 4 carbon atoms,
and (2) from about 0.01 to about 0.04 moles of a semicarbazide per mole of said developing agent.

16. The process as claimed in claim 10 wherein said semicarbazide is selected from the group consisting of (1) compounds of the formula:

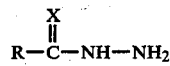

wherein R is amino, alkylamino of 1 to 6 carbon atoms, dialkylamino of 2 to 12 carbon atoms, phenylamino, diphenylamino, hydrazino, aminocarbonyl or hydrazinocarbonyl and X is oxygen or sulfur, and (2) water-soluble acid addition salts thereof.

17. The process as claimed in claim 10 wherein said semicarbazide is semicarbazide hydrochloride.

18. The process as claimed in claim 10 wherein said developing composition consists essentially of an aqueous solution of methyltriethanolammonium hydroxide and semicarbazide hydrochloride.

19. The process as claimed in claim 10 wherein said quinone diazide composition is comprised of a monomeric quinone diazide incorporated in an alkali-soluble resinous binder.

20. The process as claimed in claim 10 wherein said quinone diazide composition is comprised of a monomeric quinone diazide that has been reacted with an alkali-soluble resinous material.

21. The process as claimed in claim 10 wherein said quinone diazide composition comprises a polymeric compound formed from the condensation reaction of a quinone diazide with a phenol-formaldehyde resin.

22. The process as claimed in claim 10 wherein said quinone diazide composition comprises a polymeric compound formed from the condensation reaction of a naphthoquinone diazide with a phenol-formaldehyde resin.

23. The process as claimed in claim 10 wherein said quinone diazide has a linkage selected from the group consisting of sulfonyl, carbonyl, carbonyloxy and sulfinyloxy.

24. The process as claimed in claim 10 wherein said quinone diazide composition comprises a polymeric compound formed from the condensation reaction of 1,2-naphthoquinone-2-diazide-5-sulfonyl chloride with a phenol-formaldehyde resin.

25. The process as claimed in claim 10 wherein said quinone diazide composition comprises a non-light-sensitive film-forming polymeric binder and a polymeric compound formed from the condensation reaction of a quinone diazide with a phenol-formaldehyde resin.

26. The process as claimed in claim 10 wherein said layer of light-sensitive quinone diazide composition is a coating on a silicon wafer.

27. In a process for forming a resist image which comprises developing an imagewise-exposed layer of a light-sensitive quinone diazide composition with an alkaline developing composition, the improvement wherein said alkaline developing composition is an aqueous composition which is substantially free of metal ions, and contains a sufficient concentration of methyltriethanolammonium hydroxide to remove the exposed areas of said layer of light-sensitive quinone diazide composition without substantial removal of the unexposed areas, and a stabilizing concentration of a semicarbazide.

28. A method of stabilizing a developing composition adapted for use in developing an imagewise-exposed layer of a light-sensitive quinone diazide composition in a process for forming a resist image, said developing composition comprising a quaternary alkanol ammonium hydroxide developing agent, which method comprises incorporating a semicarbazide in said developing composition in a concentration sufficient to stabilize said composition.

29. The method as claimed in claim 28 wherein said quaternary alkanol ammonium hydroxide developing agent has the formula:

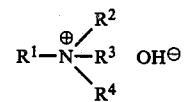

wherein
$R^1$ is a hydroxyalkyl radical of 2 to 4 carbon atoms,
$R^2$ is an alkyl radical of 2 to 4 carbon atoms,
$R^3$ is an hydroxyalkyl radical of 2 to 4 carbon atoms or an alkyl radical of 1 to 4 carbon atoms,
and $R^4$ is a hydroxyalkyl radical of 2 to 4 carbon atoms or an alkyl radical of 1 to 4 carbon atoms, and said semicarbazide is selected from the group consisting of (1) compounds of the formula:

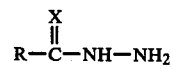

where R is amino, alkylamino of 1 to 6 carbon atoms, dialkylamino of 2 to 12 carbon atoms, phenylamino, diphenylamino, hydrazino, aminocarbonyl, or hydrazinocarbonyl and X is oxygen or sulfur, and (2) water-soluble acid addition salts thereof.

30. The method as claimed in claim 28 wherein said quaternary alkanol ammonium hydroxide developing agent is methyltriethanolammonium hydroxide and said semicarbazide is semicarbazide hydrochloride.

* * * * *